United States Patent
Namiki et al.

(10) Patent No.: US 9,548,141 B2
(45) Date of Patent: Jan. 17, 2017

(54) LIGHT-REFLECTIVE ANISOTROPIC CONDUCTIVE ADHESIVE AND LIGHT-EMITTING DEVICE

(75) Inventors: Hidetsugu Namiki, Tochigi (JP); Shiyuki Kanisawa, Tochigi (JP); Hideaki Umakoshi, Tochigi (JP)

(73) Assignee: DEXERIALS CORPORATION, Tokyo (JP)

(*) Notice: Subject to any disclaimer, the term of this patent is extended or adjusted under 35 U.S.C. 154(b) by 0 days.

(21) Appl. No.: 13/393,393

(22) PCT Filed: Jul. 20, 2010

(86) PCT No.: PCT/JP2010/062138
§ 371 (c)(1),
(2), (4) Date: Mar. 13, 2012

(87) PCT Pub. No.: WO2011/030621
PCT Pub. Date: Mar. 17, 2011

(65) Prior Publication Data
US 2012/0193666 A1    Aug. 2, 2012

(30) Foreign Application Priority Data
Sep. 14, 2009 (JP) .................................. 2009-211429

(51) Int. Cl.
*H01L 33/60* (2010.01)
*H01B 1/22* (2006.01)
(Continued)

(52) U.S. Cl.
CPC ............. *H01B 1/22* (2013.01); *C08G 18/8175* (2013.01); *C08G 59/42* (2013.01); *C09J 9/02* (2013.01);
(Continued)

(58) Field of Classification Search
USPC ........... 257/98, E33.057, E33.072, 789, 795; 252/500, 512, 519.33; 438/22, 26, 27, 29, 438/106, 118, 119
See application file for complete search history.

(56) References Cited

U.S. PATENT DOCUMENTS 4,826,284 A * 5/1989 Sakagami ................. D01F 8/04
385/123
5,846,649 A * 12/1998 Knapp ..................... B05D 1/62
428/334
(Continued)

FOREIGN PATENT DOCUMENTS

EP    1 659 840 A1    5/2006
JP    H4-259766    *    9/1992    ............. H01R 11/01
(Continued)

OTHER PUBLICATIONS

Machine translation, Shizuhata, JP 2001-332124, translation date: Sep. 7, 2013, JPO & Japio, all pages.*
(Continued)

*Primary Examiner* — Victoria K Hall
(74) *Attorney, Agent, or Firm* — Oliff PLC (57) ABSTRACT

A light-reflective anisotropic conductive adhesive used for anisotropic conductive connection of a light-emitting element to a wiring board includes a thermosetting resin composition, conductive particles, and light-reflective insulating particles. The light-reflective insulating particles are at least one of inorganic particles selected from the group consisting of titanium oxide, boron nitride, zinc oxide, and aluminum oxide, or resin-coated metal particles formed by coating the surface of scale-like or spherical metal particles with an insulating resin.

9 Claims, 3 Drawing Sheets

(51) Int. Cl.

| | | |
|---|---|---|
| *C09J 9/02* | (2006.01) | |
| *C09J 11/04* | (2006.01) | |
| *C08G 18/81* | (2006.01) | |
| *C08G 59/42* | (2006.01) | |
| *C09J 163/00* | (2006.01) | |
| *C08K 3/22* | (2006.01) | |
| *C08K 3/38* | (2006.01) | |
| *H01L 33/56* | (2010.01) | |

(52) U.S. Cl.
  CPC .............. *C09J 11/04* (2013.01); *C09J 163/00* (2013.01); *C08K 3/22* (2013.01); *C08K 3/38* (2013.01); *H01L 33/56* (2013.01); *H01L 33/60* (2013.01); *H01L 2224/16225* (2013.01); *H01L 2224/32225* (2013.01); *H01L 2224/45144* (2013.01); *H01L 2224/45147* (2013.01); *H01L 2224/48091* (2013.01); *H01L 2224/48227* (2013.01); *H01L 2224/73204* (2013.01); *H01L 2224/73265* (2013.01); *H01L 2924/07811* (2013.01)

(56) References Cited

U.S. PATENT DOCUMENTS

| | | | | |
|---|---|---|---|---|
| 6,586,484 | B1* | 7/2003 | Arito | C08G 8/10 521/129 |
| 7,381,359 | B2* | 6/2008 | Yan | C08G 59/24 257/787 |
| 8,710,662 | B2* | 4/2014 | Umakoshi | H01L 24/83 257/753 |
| 8,758,546 | B2* | 6/2014 | Ishigami | H01L 24/29 156/289 |
| 8,852,462 | B2* | 10/2014 | Umakoshi | H01L 33/60 252/500 |
| 9,487,678 | B2* | 11/2016 | Namiki | C09J 9/02 |
| 2004/0129946 | A1* | 7/2004 | Nagai | F21K 9/00 257/98 |
| 2004/0161380 | A1* | 8/2004 | Zimehl et al. | 423/610 |
| 2005/0230667 | A1* | 10/2005 | Komagata | C09J 9/02 252/500 |
| 2005/0276918 | A1* | 12/2005 | Tam | H01R 4/04 427/180 |
| 2006/0065330 | A1* | 3/2006 | Cooper | C22C 1/08 148/538 |
| 2007/0079665 | A1* | 4/2007 | Sasaki | B22F 9/24 75/255 |
| 2007/0262338 | A1* | 11/2007 | Higashi | H01L 33/38 257/99 |
| 2008/0105950 | A1* | 5/2008 | Ishida et al. | 257/615 |
| 2008/0268637 | A1* | 10/2008 | Inaba | 438/660 |
| 2009/0008662 | A1* | 1/2009 | Ashdown | H01L 25/0753 257/98 |
| 2009/0160320 | A1* | 6/2009 | Borner et al. | 313/504 |
| 2009/0273000 | A1* | 11/2009 | Kon | H01L 33/46 257/98 |
| 2010/0295201 | A1* | 11/2010 | Mihori | B29C 39/18 264/54 |
| 2010/0320479 | A1* | 12/2010 | Minato | H01L 33/505 257/88 |
| 2011/0001148 | A1* | 1/2011 | Sun | H01L 33/60 257/88 |
| 2011/0077328 | A1* | 3/2011 | Valette | C08L 63/00 523/400 |
| 2012/0175660 | A1* | 7/2012 | Namiki | C08L 23/02 257/98 |
| 2012/0248495 | A1* | 10/2012 | Umakoshi et al. | 257/99 |
| 2013/0087825 | A1* | 4/2013 | Umakoshi | H01L 33/60 257/99 |
| 2013/0092310 | A1* | 4/2013 | Ishigami | H01L 24/29 156/60 |
| 2013/0264602 | A1* | 10/2013 | Namiki | H01L 33/60 257/98 |
| 2014/0001419 | A1* | 1/2014 | Namiki | H01R 4/04 252/513 |
| 2014/0248477 | A1* | 9/2014 | Ishigami | H01L 24/29 428/215 |
| 2015/0166847 | A1* | 6/2015 | Morita | H01L 33/46 257/98 |

FOREIGN PATENT DOCUMENTS

| | | | | |
|---|---|---|---|---|
| JP | A-0362104 | | 12/1992 | |
| JP | H7-118617 | * | 5/1995 | ............... C09J 9/02 |
| JP | A-07-288330 | | 10/1995 | |
| JP | A-09-227849 | | 9/1997 | |
| JP | A-10-030082 | | 2/1998 | |
| JP | A-11-017073 | | 1/1999 | |
| JP | A-11-168235 | | 6/1999 | |
| JP | A-2000-215730 | | 4/2000 | |
| JP | A-2001-234152 | | 8/2001 | |
| JP | 2001-332124 | * | 11/2001 | ............... H01B 1/22 |
| JP | A-2001-332124 | | 11/2001 | |
| JP | A-2003-249689 | | 9/2003 | |
| JP | 2004-179139 | * | 6/2004 | ............... H01B 5/00 |
| JP | A-2004-325631 | | 11/2004 | |
| JP | A-2006-008775 | | 1/2006 | |
| JP | 2007-181925 | * | 7/2007 | ............. B23B 15/08 |
| JP | A-2007-181925 | | 7/2007 | |
| JP | A-2007-258324 | | 10/2007 | |
| JP | A-2008-143981 | | 6/2008 | |
| TW | 200929262 A | | 7/2009 | |
| WO | WO 2009/069670 | * | 4/2009 | ............. H01L 33/00 |
| WO | WO 2009/069671 | * | 4/2009 | ............. H01L 33/00 |

OTHER PUBLICATIONS

Machine translation, Yamamura, JP 2007-181925, translation date: Sep. 6, 2013, JPO & Japio, all pages.*
English translation, Tamura, JP H7-118617, translation date: Sep. 2008, Schreiber Translation, Inc., all pages.*
Machine translation, Kishimoto, Japanese Patent Publication No. 2000-215730, translation date: Jan. 6, 2015, JPO & Japio, all pages.*
English translation, Tsukagoshi, Japanese Pat. Pub. No. H4-259766, translation date: Jan. 2007, Schreiber Translations, Inc., all pages.*
Machine translation, Nukui, Japanese Pat. Pub. No. 2004-179139, translation date: Oct. 23, 2015, Espacenet, all pages.*
Machine translation, Shizuhata, Japanese Pat. Pub. No. 2001-332124, translation date: Sep. 7, 2013, JPO & Japio, all pages.*
Machine translation, Yamamura, Japanese Pat. Pub. No. 2007-181925, translation date: Sep. 6, 2013, JPO & Japio, all pages.*
English translation, Tamura, Japanese Pat. Pub. No. H7-118617, translation date: Sep. 2008, Schreiber Translations, Inc., all pages.*
English translation, Shizuhata, Japanese Pat. Pub. No. 2001-332124, translation date: Sep. 2013, FLS, Inc., all pages.*
Japanese Standards Association, Japanese Industrial Standard JIS K 7105, "Testing Methods for Optical Properties of Plastics", Mar. 1981 (translation date: 1982).*
English translation, Jong-Min Kim, Recent Advances in Coductive [sic] Adhesives in Electronic Packaging, Journal of Korean Welding and Joining Society, vol. 25, Issue No. 2 (2007), translation date: Nov. 2016, Schreiber Translations, Inc., all pages.*
Sep. 14, 2010 Written Opinion of the International Searching Authority issued in International Patent Application No. PCT/JP2010/062138.
Sep. 14, 2010 International Search Report issued in International Patent Application No. PCT/JP2010/062138 (with translation).
Feb. 27, 2013 Office Action issued in Chinese Patent Application No. 201080040903.2 (with translation).
Jan. 13, 2014 Office Action issued in Taiwanese Patent Application No. 99126882 (with translation).
Nov. 19, 2013 Office Action issued in Japanese Patent Application No. 2009-211429 (with translation).
Jan. 3, 2014 Office Action issued in Chinese Patent Application No. 201080040903.2 (with translation).

(56) References Cited

OTHER PUBLICATIONS

Submission of Publications and the Like dated Aug. 27, 2013 issued in Japanese Patent Application No. 2009-211429 (with translation). (18 pages).
Submission of Publications and the Like dated Aug. 27, 2013 issued in Japanese Patent Application No. 2009-211429 (with translation). (22 pages).
Aug. 15, 2014 Office Action issued in Taiwanese Application No. 099126882 (with partial English Translation).
Jun. 11, 2014 Extended European Search Report issued in Application No. 10815218.2.
XP-002725128 Database CA [online] Chemical Abstract Service, Jan. 13, 2006, 2 pages.
XP-002725129 Database CA[online] Chemical Abstract Service, Aug. 4, 2010, 2 pages.
Aug. 10, 2015 Office Action issued in Taiwanese Patent Application No. 99126882.
Sep. 22, 2016 Office Action issued in Korean Patent Application No. 2011-7019514.
Jong-Min Kim, "Recent Advances on Conductive Adhesives in Electronic Packaging," Journal of KWJS, vol. 25, No. 2, Apr. 30, 2007, pp. 133-138.

* cited by examiner

Related Art

FIG. 5

Related Art

LIGHT-REFLECTIVE ANISOTROPIC CONDUCTIVE ADHESIVE AND LIGHT-EMITTING DEVICE

TECHNICAL FIELD

The present invention relates to a light-reflective anisotropic conductive adhesive used for anisotropic conductive connection of a light-emitting element to a wiring board, and a light-emitting device formed by using this adhesive to mount a light-emitting element to a wiring board.

BACKGROUND ART

Figure 4:
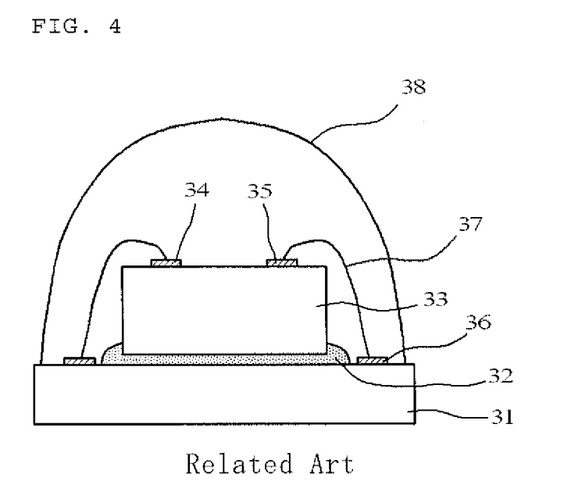
FIG. 4 is a cross-sectional view of a conventional light-emitting device.

Light-emitting devices that use a light-emitting diode (LED) element are widely used. Older-type light-emitting devices are configured by, as illustrated in FIG. 4, joining an LED element 33 to a substrate 31 with a die bond adhesive 32, wire-bonding a p electrode 34 and an n electrode 35 on an upper face of the LED element 33 to a connection terminal 36 on the substrate 31 with a gold wire 37, and then sealing the whole of the LED element 33 with a transparent mold resin 38. However, for the light-emitting device illustrated in FIG. 4, there is the problem that, among the light emitted by the LED element 33, the light having a wavelength of 400 to 500 nm that is output to the upper face side is absorbed by the gold wire, and a part of the light output to the lower face side is absorbed by the die bond adhesive 32, whereby the light-emitting efficiency of the LED element 33 deteriorates.

Figure 5:
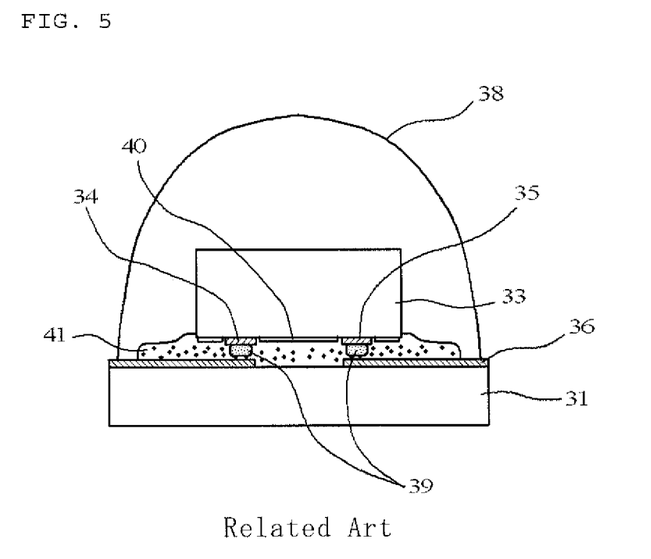
FIG. 5 is a cross-sectional view of a conventional light-emitting device.

Consequently, as illustrated in FIG. 5, flip chip mounting of the LED element 33 has been proposed (Patent Literature 1). In this flip chip mounting technique, a bump 39 is formed on both the p electrode 34 and the n electrode 35. Further, a light-reflecting layer 40 is provided on the surface of the LED element 33 on which the bumps are formed so that the p electrode 34 and the n electrode 35 are insulated. The LED element 33 and the substrate 31 are fixedly connected using an anisotropic conductive paste 41 or an anisotropic conductive film (not illustrated), and curing the paste or film. Consequently, in the light-emitting device illustrated in FIG. 5, the light output toward the upper side of the LED element 33 is not absorbed by the gold wire, and most of the light output toward the lower side is reflected by the light-reflecting layer 40 and is output upwards. As a result, the light-emitting efficiency (light extraction efficiency) does not deteriorate.

CITATION LIST

Patent Literature

[Patent Literature 1] Japanese Patent Application Laid-Open No. Hei. 11-168235

SUMMARY OF THE INVENTION

Problems to be Solved by the Invention

However, with the technique described in Patent Document 1, the light-reflecting layer 40 has to be provided on the LED element 33 by a method such as metal vapor deposition so that the p electrode 34 and n electrode 35 are insulated. Therefore, from a production perspective, there is the problem that an increase in costs cannot be avoided.

On the other hand, if the light-reflecting layer 40 is not provided, the surface of the conductive particles coated with gold, nickel, or copper in the cured anisotropic conductive paste or anisotropic conductive film exhibit a color that is from brown to dark brown. Further, the epoxy resin binder in which the conductive particles are dispersed itself also exhibits a brown color due to the imidazole latent curing agent that is normally used for curing. Consequently, there is the problem that it is difficult to improve the light-emitting efficiency (light extraction efficiency) of the light emitted by the light-emitting element.

It is an object of the present invention to resolve the above-described problems in the conventional art, and to provide an anisotropic conductive agent capable of improving light-emitting efficiency, and a light-emitting device formed by using that adhesive for flip-chip mounting of a light-emitting element to a wiring board, even if a light-reflecting layer that causes production costs to increase is not provided on a light-emitting diode (LED) element, when producing a light-emitting device by flip-chip mounting a light-emitting element such as an LED element on a wiring board using an anisotropic conductive adhesive.

Means to Solve the Problems

Based on the hypothesis that deterioration in light-emitting efficiency can be prevented if an anisotropic conductive adhesive itself is made to have a light-reflecting function, the present inventor has found that deterioration in the light-emitting efficiency of a light-emitting element can be prevented by blending light-reflective insulating particles in an anisotropic conductive adhesive, thereby completing the present invention.

Specifically, the present invention provides a light-reflective anisotropic conductive adhesive used for anisotropic conductive connection of a light-emitting element to a wiring board, comprising a thermosetting resin composition, conductive particles, and light-reflective insulating particles.

Further, as an particularly preferred aspect of this light-reflective anisotropic conductive adhesive, the present invention provides a light-reflective anisotropic conductive adhesive in which the conductive particle comprises a light-reflective conductive particle formed from a core particle coated with a metal material, and a light-reflecting layer formed on a surface of the core particle, the light-reflecting layer being formed from at least one of inorganic particles selected from the group consisting of titanium oxide particles, zinc oxide particles, and aluminum oxide particles.

In addition, the present invention provides a light-emitting device comprising a wiring board and a light-emitting element flip-chip-mounted thereon through the above-mentioned light-reflective anisotropic conductive adhesive provided therebetween.

Advantageous Effects of the Invention

The light-reflective anisotropic conductive adhesive of the present invention used for anisotropic conductive connection of a light-emitting element to a wiring board includes light-reflective insulating particles. Therefore, this light-reflective anisotropic conductive adhesive can reflect light. The wavelength (of the visible light) dependence of the reflection property (reflectance) of the light-reflective anisotropic conductive adhesive is small when the light-reflective insulating particle is at least one of inorganic particles selected from the group consisting of titanium oxide particles, boron nitride particles, zinc oxide particles, and aluminum oxide particles, or a resin-coated metal particle formed by coating the surface of scale-like or spherical particles with an insulating resin, since these particles themselves are almost white. Consequently, light-emitting efficiency can be improved, and the emitted light color of the light-emitting element can be maintained without color-change upon reflection.

Moreover, the wavelength (of the visible light) dependence of the reflection property (reflectance) of the light-reflective anisotropic conductive adhesive is small when light-reflective conductive particles are formed from a core particle coated with a metal material and a light-reflecting layer formed from titanium oxide particles, zinc oxide particles, or aluminum oxide particles on the surface of the core particle are used as conductive particles, since these light-reflective conductive particles themselves exhibit a grey to white color. Consequently, light-emitting efficiency can be further improved, and the emitted light color of the light-emitting element can be maintained without color-change upon reflection.

DESCRIPTION OF THE EMBODIMENTS

The present invention is a light-reflective anisotropic conductive adhesive that is used for anisotropic conductive connection of a light-emitting element to a wiring board, and that contains a thermosetting resin composition, conductive particles, and light-reflective insulating particles. Thus, a significant feature of the light-reflective anisotropic conductive adhesive of the present invention resides in containing the light-reflective insulating particles.

In the present invention, the light-reflective insulating particles are for reflecting light that is incident on the anisotropic conductive adhesive to externally reflect.

Examples of the particles having a light reflecting property include metal particles, resin-coated metal particles, particles such as metal oxides that are grey to white under natural light, metal nitrides, and metal sulfides, and particles formed by coating a resin core particle with inorganic particles. Further, the particles may have irregularities on their surface irrespective of the materials for the particles. However, among these particles, metal particles are not included in the light-reflective insulating particles that can be used in the present invention, due to the need to exhibit an insulating property. Further, among metal oxide particles, conductive particles such as ITO cannot be used. In addition, even among inorganic particles having a light reflecting property and an insulating property, particles that have a lower refractive index than the used thermosetting resin composition, like $SiO_2$, cannot be used.

Thus, preferred specific examples of the light-reflective insulating particles include at least one kind of inorganic particle selected from the group consisting of titanium oxide ($TiO_2$), boron nitride (BN), zinc oxide (ZnO), and aluminum oxide ($Al_2O_3$). Among these, it is preferred to use $TiO_2$ due to its high refractive index.

The shape of the light-reflective insulating particles may be spherical, scale-like, amorphous, needle-like and the like. However, in view of reflectance, a spherical or scale-like shape is preferred. Further, when the particles have a spherical shape, if the size of the particles is too small, reflectance tends to deteriorate, while if the size is too large, connection via the anisotropic conductive particles tends to be inhibited. Therefore, the size is preferably 0.02 to 20 µm, and more preferably 0.2 to 1 µm. For a scale-like shape, the long diameter is preferably 0.1 to 100 µm, and more preferably 1 to 50 µm, the short diameter is preferably 0.01 to 10 µm, and more preferably 0.1 to 5 µm, and the thickness is preferably 0.01 to 10 µm, and more preferably 0.1 to 5 µm.

It is preferred that the light-reflective insulating particles formed from inorganic particles have a refractive index (JIS K7142) that is greater than the refractive index (JIS K7142) of the cured thermosetting resin composition, and more preferably greater by at least about 0.02. This is because the reflection efficiency at the interfaces of these particles deteriorates if the refractive index difference is small.

For the light-reflective insulating particles, although the above-described inorganic particles may be used, resin-coated metal particles formed by coating the surface of metal particles with a transparent insulating resin may also be used. Examples of metal particles that can be used include nickel, silver, aluminum and the like. Examples of the shape of the particles include amorphous shape, spherical shape, scale-like shape, needle-like shape and the like. Among them, preferred are spherical shape from the perspective of light diffusion effect, and scale-like shape from the perspective of total reflection effect. Particularly preferred are, from the perspective of light reflectance, scale-like shape and spherical shape. Among these, scale-like silver particles are much more particularly preferred.

Although the size of the resin-coated metal particles serving as the light-reflective insulating particles depends on the shape, generally, if the size is too large, connection with the anisotropic conductive particles can be hindered, while if the size is too small, light is not as reflected as easily. Therefore, the particle size is preferably, for a spherical shape, 0.1 to 30 µm, and more preferably 0.2 to 10 µm. For a scale-like shape, the long diameter is preferably 0.1 to 100 µm, and more preferably 1 to 50 µm, and the thickness is preferably 0.01 to 10 µm, and more preferably 0.1 to 5 µm. Here, if the particles are covered with an insulating coating, the size of the light-reflective insulating particles is the size that includes this insulating coating.

As the resin in such resin-coated metal particles, various insulating resins may be used. From perspectives such as mechanical strength and transparency, it is preferred to use a cured product of an acrylic resin. Examples thereof include a resin formed by radical copolymerization of methyl methacrylate and 2-hydroxyethyl methacrylate in the presence of a radical initiator, such as an organic peroxide such as benzoyl peroxide. In this case, it is more preferred that the resin be cross-linked with an isocyanate cross-linking agent, such as 2,4-tolylene diisocyanate.

Further, it is preferred that the metal particles have had a γ-glycidoxy group, a vinyl group and the like introduced into their surface in advance with a silane coupling agent.

Such resin-coated metal particles can be produced by, for example, adding the metal particles and a silane coupling agent into a solvent such as toluene, stirring for 1 hour at room temperature, then adding a radical monomer and a radical polymerization initiator, and optionally a cross-linking agent, and then stirring the resultant mixture while heating to the radical polymerization initiation temperature.

If the blended amount of the above-described light-reflective insulating particles in the light-reflective anisotropic conductive adhesive is too low, sufficient light reflectance cannot be realized, while if the blended amount is too large, connection based on the conductive particles also being used is inhibited. Therefore, the blended amount in the thermosetting resin composition is preferably 1 to 50% by volume, and more preferably 2 to 25% by volume.

As the conductive particles forming the light-reflective anisotropic conductive adhesive of the present invention, particles of metals that are conventionally used as conductive particles for anisotropic conductive connection can be used. Examples thereof include gold, nickel, copper, silver, solder, palladium, aluminum, alloys thereof, multilayer composites thereof (for example, a nickel plating/gold flash plating composite) and the like. Among these, gold, nickel, and copper can exhibit the advantages effects of the present invention more than other metal materials, as they make the conductive particles brown.

As the conductive particles, metal-coated resin particles formed by coating resin particles with a metal material can be used. Examples of such resin particles include styrene resin particles, benzoguanamine resin particles, nylon resin particles and the like. A conventionally-known method may be employed for coating the resin particles with a metal material. For example, an electroless plating method or an electroplating method may be utilized. Further, the thickness of the coated metal material is a thickness that is sufficient to ensure a good connection reliability. Although this depends on the particle size of the resin particles and the type of metal, usually, the thickness is 0.1 to 3 μm.

Further, if the particle size of the resin particles is too small, electrical continuity failures tend to occur, while if the particle size is too large, short circuits between patterns tend to occur. Therefore, the particle size is preferably 1 to 20 μm, more preferably 3 to 10 μm, and particularly preferably 3 to 5 μm. In this case, it is preferred that the shape of the core particle 1 be spherical, although the shape may also be flake-like or a rugby ball shape.

The preferred metal-coated resin particle shape is spherical. Since the connection reliability deteriorates if the particle size of these particles is too large, the particle size is preferably 1 to 20 μm, and more preferably 3 to 10 μm.

Figure 1A:
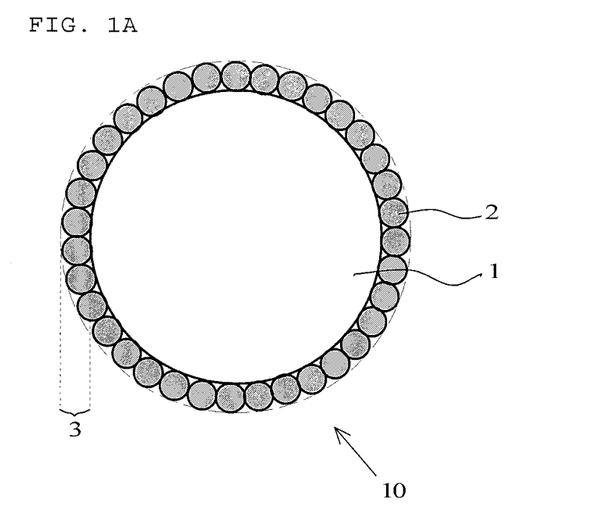
FIG. 1A is a cross-sectional view of a light-reflective conductive particle of the present invention for an anisotropic conductive adhesive.
Figure 1B:
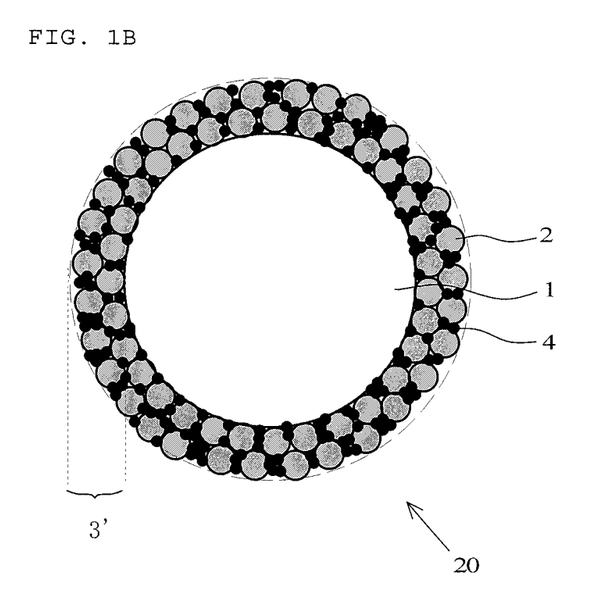
FIG. 1B is a cross-sectional view of a light-reflective conductive particle of the present invention for an anisotropic conductive adhesive.

In the present invention, it is particularly preferred that the light-reflective conductive particles be formed by imparting a light reflecting property to the above-described conductive particles. FIGS. 1A and 1B are cross-sectional views of such light-reflective conductive particles 10 and 20. First, the light-reflective conductive particle of FIG. 1A will be described.

The light-reflective conductive particle 10 comprises a core particle 1 coated with a metal material, and a light-reflecting layer 3 provided on a surface of the core particle, where the light-reflecting layer 3 is formed from at least one of inorganic particles 2 selected from titanium oxide ($TiO_2$) particles, zinc oxide (ZnO) particles, and aluminum oxide ($Al_2O_3$) particles. The titanium oxide particles, zinc oxide particles, or aluminum oxide particles are inorganic particles that look white under sunlight. Therefore, the light-reflecting layer 3 formed from these particles exhibits a color from white to grey. The fact that this layer exhibits a color from white to grey means that the wavelength (of the visible light) dependence of the reflection property (reflectance) of the light-reflecting layer is small, and that visible light is easily reflected.

Among the titanium oxide particles, zinc oxide particles, or aluminum oxide particles, if there are concerns about light degradation of the cured thermosetting resin composition in the cured light-reflective anisotropic conductive adhesive, zinc oxide, which does not exhibit a catalytic activity with regard to light degradation and has the highest refractive index, can be preferably used.

Since the core particle 1 is used for anisotropic conductive connection, the surface of the core particle 1 is formed from a metal material. As described above, modes in which the surface is coated with a metal material include a mode in which the core particle 1 itself is a metal material, and a mode in which the surface of a resin particle is coated with a metal material.

When viewed from the perspective of relative size to the particle size of the core particle 1, if the thickness of the light-reflecting layer 3 formed from the inorganic particles 2 is too small with respect to the particle size of the core particle 1, reflectance deteriorates, while if this thickness is too large, electrical continuity failures occur. Therefore, the thickness is preferably 0.5 to 50%, and more preferably 1 to 25% of the particle size of the core particle 1.

Further, in the light-reflective conductive particle 10, if the particle size of the inorganic particles 2 forming the light-reflecting layer 3 is too small, it tends to be difficult to produce a light-reflecting phenomenon, while if this particle size is too large, it tends to be difficult to form the light-reflecting layer. Therefore, the particle size is preferably 0.02 to 4 μm, more preferably 0.1 to 1 μm, and particularly preferably 0.2 to 0.5 μm. In this case, from the perspective of the wavelength of the light that is reflected, it is preferred that the particle size of the inorganic particles 2 be 50% or more of the wavelength of that light so that the light that should be reflected (i.e., the light emitted by the light-emitting element) does not pass through. In this case, examples of the shape of the inorganic particles 2 include amorphous shape, spherical shape, scale-like shape, needle-like shape and the like. However, among these, from the perspective of a light diffusion effect, spherical shape is preferred, and from a total reflection effect, a scale-like shape is preferred.

The light-reflective conductive particle 10 illustrated in FIG. 1A can be produced by a known deposition technology (so-called mechanofusion) in which a film formed from small particles on the surface of large particles is formed by making the small and large particles physically collide with each other. In this case, the inorganic particles 2 are fixed so as to sink the metal material into the surface of the core particles 1. On the other hand, it is difficult to make inorganic particles fuse and fix together. Accordingly, a monolayer of inorganic particles forms the light-reflecting layer 3. Therefore, in the case of FIG. 1A, the thickness of the light-reflecting layer 3 can be considered to be the same or slightly thinner than the particle size of the inorganic particles 2.

Next, the light-reflective conductive particle 20 illustrated in FIG. 1B will be described. The light-reflective conductive particle 20 differs from the light-reflective conductive particle 10 of FIG. 1A in including a thermoplastic resin 4 by which the light-reflecting layer 3' functions as an adhesive, and in that the inorganic particles 2 themselves are also fixed by this thermoplastic resin 4 so that the inorganic particles 2 form a multilayer structure (for example, a two- or three-layer multilayer structure). By including such a thermoplastic resin 4, the mechanical strength of the light-reflecting layer 3' improves, and it is more difficult for the inorganic particles to fall off and the like.

In consideration of the burden on the environment, it is preferred to use a halogen-free thermoplastic resin as the thermoplastic resin 4. For example, it is preferred to use a polyolefin such as polyethylene and polypropylene, polystyrene, an acrylic resin and the like.

This light-reflective conductive particle 20 can also be produced by mechanofusion. If the particle size of the thermoplastic resin 4 employed in mechanofusion is too small, its adhesion function deteriorates, while if this particle size is too large, it is more difficult to adhere to the core particle. Therefore, the particle size is preferably 0.02 to 4 µm, and more preferably 0.1 to 1 µm. Further, if the blended amount of such a thermoplastic resin 4 is too low, its adhesion function deteriorates, while if this blended amount is too much, particle agglomerates form. Therefore, the blended amount is preferably, based on 100 parts by mass of the inorganic particles 2, 0.2 to 500 parts by mass, and more preferably 4 to 25 parts by mass.

It is preferred to use a composition that is as colorless and transparent as possible for the thermosetting resin composition used in the light-reflective anisotropic conductive adhesive of the present invention. This is to prevent deterioration in the light reflection efficiency of the light-reflective conductive particles in the anisotropic conductive adhesive, and to reflect the incident light without changing its color. Here, "colorless and transparent" means a light transmittance (JIS K7105) of 80% or more, and preferably 90% or more, at a 1 cm light path length of visible light having a wavelength of 380 to 780 nm.

In the light-reflective anisotropic conductive adhesive of the present invention, if the blended amount of the conductive particles, such as the light-reflective conductive particles based on 100 parts by mass of the thermosetting resin composition is too low, electrical continuity failures tend to occur, while if the blended amount is too much, short circuits between patterns tend to occur. Therefore, the blended amount is preferably 1 to 100 parts by mass, and more preferably 10 to 50 parts by mass.

Concerning the reflection properties of the light-reflective anisotropic conductive adhesive of the present invention, to improve the light-emitting efficiency of the light-emitting element, it is preferred that the reflectance (JIS K7105) of the cured light-reflective anisotropic conductive adhesive to light with a wavelength of 450 nm is at least 30%. To obtain such a reflectance, the reflection properties and blended amount of the used light-reflective conductive particles, and the blended composition of the thermosetting resin composition may be appropriately adjusted. Generally, if the blended amount of light-reflective conductive particles having good reflection properties is increased, the reflectance also tends to increase.

The reflection properties of the light-reflective anisotropic conductive adhesive can also be evaluated from the perspective of refractive index. Specifically, this is because if the refractive index of the cured product is greater than the refractive index of the cured thermosetting resin composition excluding the conductive particles and the light-reflective insulating particles, the light reflection amount at the interface between the light-reflective insulating particles and the cured thermosetting resin composition encircling those particles increases. More specifically, the difference obtained by subtracting the refractive index of the cured thermosetting resin composition (JIS K7142) from the refractive index (JIS K7142) of the light-reflective insulating particles is preferably 0.02 or more, and more preferably 0.2 or more. Generally, the refractive index of the thermosetting resin composition that mainly includes an epoxy resin is approximately 1.5.

As the thermosetting resin composition forming the light-reflective anisotropic conductive adhesive of the present invention, a resin composition that is used in conventional anisotropic conductive adhesives and anisotropic conductive films can be used. Generally, such a thermosetting resin composition is prepared by blending a curing agent in an insulating binder resin. Preferred examples of the insulating binder resin include epoxy resins having an alicyclic epoxy compound, a heterocyclic epoxy compound, a hydrogenated epoxy compound or the like as a main component.

It is preferred that the alicyclic epoxy compound has two or more epoxy groups in the molecule. The alicyclic epoxy compound may be a liquid or a solid. Specific examples include glycidyl hexahydrobisphenol A, 3,4-epoxycyclohexenylmethyl-3',4'-epoxycyclohexene carboxylate and the like. Among these, from the perspectives of ensuring that the cured product has an optical transparency suitable for mounting an ZED element and the like, and excellent fast-curing properties, it is preferred to use glycidyl hexahydrobisphenol A or 3,4-epoxycyclohexenylmethyl-3',4'-epoxycyclohexene carboxylate.

Examples of heterocyclic epoxy compounds include epoxy compounds having a triazine ring. Particularly preferred is 1,3,5-tris(2,3-epoxypropyl)-1,3,5-triazine-2,4,6-(1H,3H,5H)-trione.

As the hydrogenated epoxy compound, hydrogenated products of the above-described alicyclic epoxy compounds and heterocyclic epoxy compounds, and other well-known hydrogenated epoxy resins can be used.

The alicyclic epoxy compound, heterocyclic epoxy compound, and hydrogenated epoxy compound may be used alone, or two or more kinds may be used together. Further, other epoxy compounds can also be used, as long as the effects of the present invention are not harmed. Examples thereof include known epoxy resins such as: glycidyl ethers obtained by reacting epichlorohydrin with a polyhydric phenol such as bisphenol A, bisphenol F, bisphenol S, tetramethylbisphenol A, diallylbisphenol A, hydroquinone, catechol, resorcin, cresol, tetrabromobisphenol A, trihydroxybiphenyl, benzophenone, bisresorcinol, bisphenol hexafluoroacetone, tetramethylbisphenol A, tetramethylbisphenol F, tris(hydroxyphenyl)methane, bixylenol, phenol-novolac, or cresol-novolac; polyglycidyl ethers obtained by reacting epichlorohydrin with an aliphatic polyhydric alcohol such as glycerin, neopentyl glycol, ethylene glycol, propylene glycol, butylene glycol, hexylene glycol, polyethylene glycol, or polypropylene glycol; glycidyl ether esters obtained by reacting epichlorohydrin with a hydroxycarboxylic acid such as p-oxybenzoic acid or α-oxynaphthoic acid; polyglycidyl esters obtained from polycarboxylic acids such as phthalic acid, methylphthalic acid, isophthalic acid, terephthalic acid, tetrahydrophthalic acid, endomethylene tetrahydrophthalic acid, endomethylene hexahydrophthalic acid, trimellitic acid, and polymerized fatty acids; glycidylaminoglycidyl ethers obtained from aminophenols and aminoalkylphenols; glycidylaminoglycidyl esters obtained from aminobenzoic acids; glycidylamines obtained from aniline, toluidine, tribromoaniline, xylylenediamine, diamino cyclohexane, bisaminomethylcyclohexane, 4,4'-diaminodiphenyl methane, and 4,4'-diaminodiphenyl sulfone; and epoxydized polyolefins.

Examples of the curing agent include acid anhydrides, imidazole compounds, cyanogens and the like. Among these, it is preferred to use acid anhydrides that tend not to change the color of the cured product, especially an alicyclic acid anhydride curing agent. A specific preferred example includes methyl hexahydrophthalic anhydride.

When using an alicyclic epoxy compound and an alicyclic acid anhydride curing agent in the thermosetting resin composition of the light-reflective anisotropic conductive adhesive of the present invention, if the used amount of the alicyclic acid anhydride curing agent is too low, the amount of uncured epoxy compound tends to increase, while if the used amount is too much, corrosion of the coated material tends to be promoted due to the influence of excess curing agent. Therefore, it is preferred to use the alicyclic acid anhydride curing agent in a ratio of, based on 100 parts by mass of alicyclic epoxy compound, 80 to 120 parts by mass, and more preferably 95 to 105 parts by mass.

The light-reflective anisotropic conductive adhesive of the present invention can be produced by uniformly mixing the light-reflective insulating particles, conductive particles (preferably light-reflective conductive particles), and thermosetting resin composition. Further, if forming a light-reflective anisotropic conductive film, this film can be obtained by dispersing and mixing the above materials in a solvent such as toluene, coating the resultant mixture to a desired thickness on a release-treated PET film, and then drying at a temperature of approximately 80° C.

Figure 2:
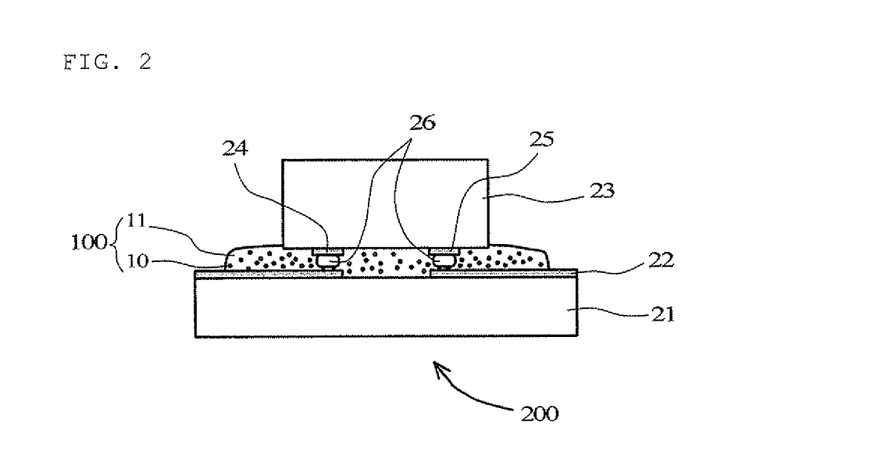
FIG. 2 is a cross-sectional view of a light-emitting device of the present invention.

Next, the light-emitting device of the present invention will be described with reference to FIG. 2. A light-emitting device 200 is a light-emitting device in which the above-described light-reflective anisotropic conductive adhesive of the present invention is coated between a connection terminal 22 on a substrate 21 and connection bumps 26 respectively formed on an n electrode 24 and a p electrode 25 of an LED element 23 as light-emitting elements, so that the LED element 23 are flip-chip mounted on the substrate 21. Here, the cured product 100 of the light-reflective anisotropic conductive adhesive in FIG. 2 is formed with light-reflective insulating particles (not illustrated) and light-reflective conductive particles 10 dispersed in a cured product 11 of the thermosetting resin composition. A non-light-reflective conductive particle may be used instead of the light-reflective conductive particle 10. Optionally, a transparent mold resin may be applied so as to seal the whole of the LED element 23. Further, a light-reflecting layer may be provided on the LED element 23, as is performed conventionally.

In the thus-configured light-emitting device 200, of the light emitted by the LED element 23, the light emitted toward the substrate 21 side is reflected by the light-reflective insulating particles and the light-reflective conductive particles 10 in the cured product 100 of the light-reflective anisotropic conductive adhesive, and is output from the upper face of the LED element 23. Therefore, a deterioration in the light-emitting efficiency can be prevented.

The components (the LED element 23, the bumps 26, the substrate 21, the connection terminal 22 etc.) other than the light-reflective anisotropic conductive adhesive in the light-emitting device 200 may be configured in the same manner as in a conventional light-emitting device. Further, other than using the light-reflective anisotropic conductive adhesive of the present invention, the light-emitting device 200 of the present invention can be produced by utilizing conventional anisotropic conductive connection techniques. In addition, as the light-emitting element, other than an LED element, known light-emitting elements can be employed, as long as the effects of the present invention are not harmed.

EXAMPLES

Example 1

A light-reflective anisotropic conductive adhesive having a white appearance was obtained by uniformly mixing 12% by volume of a titanium dioxide powder having an average particle size of 0.5 μm (KR-380, Titan Kogyo, Ltd.) as light-reflective insulating particles and 10% by mass of Au-coated resin conductive particles having an average particle size of 5 μm (particles formed by coating a 0.2 μm-thick electroless gold plating on spherical acrylic resin particles having an average particle size of 4.6 μm (Bright 20GNB4.6EH, Nippon Chemical Industrial Co., Ltd.)) as conductive particles in a colorless, transparent thermosetting epoxy binder composition having a refractive index of approximately 1.50 (YX-8000, JER Co. Ltd.: containing 50% by mass of MeHHPA).

(Optical Reflectance Evaluation Test)

The obtained light-reflective anisotropic conductive adhesive was coated on a white ceramic plate to a dry thickness of 100 μm, and heated for 1 minute at 200° C. to cure. The reflectance of this cured product to light with a wavelength of 450 nm (JIS K7150) was measured using a spectrophotometer (U3300, Hitachi, Ltd.). The obtained results are shown in Table 1 and in FIG. 3. In practice, a reflectance of 30% or more is desired.

(Total Luminous Flux Evaluation Test for an LED-Mounted Sample)

On a glass epoxy substrate having wires formed by plating Ni/Au (5.0 μm thick/0.3 μm thick) on a copper wire at a 100 μm pitch, 15 μm-high gold bumps were formed using a bump bonder (FB700, Kaijo Corporation). A blue LED (Vf=3.2 (If=20 mA)) was flip-chip mounted under conditions of 200° C., 60 seconds, and 1 Kg/chip on the epoxy substrate formed with gold bumps using the light-reflective anisotropic conductive adhesive to obtain a test LED module.

The total luminous flux of the obtained test LED module was measured (measurement conditions: If=20 mA (constant current control)) using a total luminous flux measurement system (sphere type) (LE-2100, Otsuka Electronics Co., Ltd.). The obtained results are shown in Table 1. In practice, a total luminous flux of 300 mlm or more is desired.

Example 2

Figure 3:
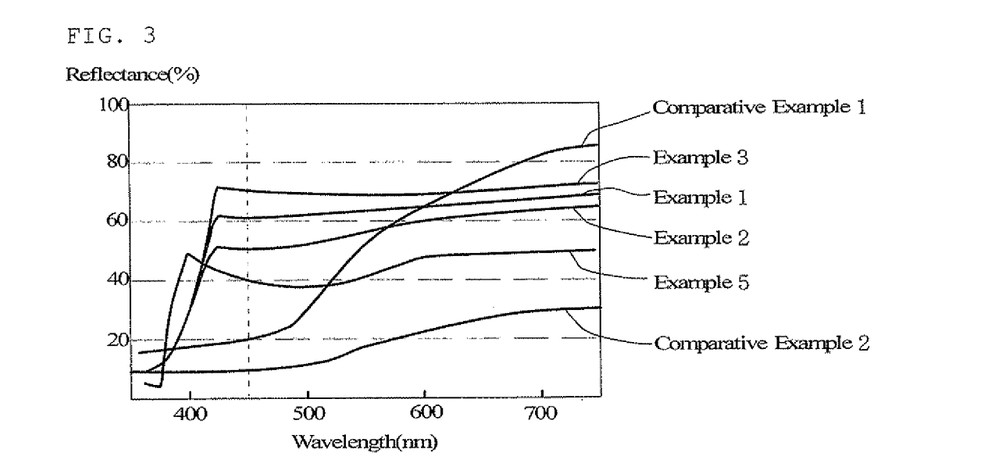
FIG. 3 is a graph illustrating the light reflectance of the cured anisotropic conductive adhesive of Examples 1, 2, 3, and 5 and Comparative Examples 1 and 2 with respect to wavelength.

A light-reflective anisotropic conductive adhesive having a white appearance was obtained in the same manner as in Example 1, except that the blended amount of the titanium dioxide powder was 7% by volume. Further, an optical reflectance evaluation test and a total luminous flux evaluation test for an LED-mounted sample were carried out in the same manner as in Example 1. The obtained results are shown in Table 1. The optical reflectance results are also illustrated in FIG. 3.

Example 3

A light-reflective anisotropic conductive adhesive having a white appearance was obtained in the same manner as in Example 1, except that the blended amount of the titanium dioxide powder was 21% by volume. Further, an optical reflectance evaluation test and a total luminous flux evaluation test for an LED-mounted sample were carried out in the same manner as in Example 1. The obtained results are shown in Table 1. The optical reflectance results are also illustrated in FIG. 3.

Example 4

A light-reflective anisotropic conductive adhesive having a white appearance was obtained in the same manner as in Example 1, except that 12% by volume of a boron nitride powder having an average particle size of 0.5 µm (SP7, Denki Kagaku Kogyo Kabushiki Kaisha) was used instead of the titanium dioxide powder. Further, an optical reflectance evaluation test and a total luminous flux evaluation test for an LED-mounted sample were carried out in the same manner as in Example 1. The obtained results are shown in Table 1.

Example 5

A light-reflective anisotropic conductive adhesive having a white appearance was obtained in the same manner as in Example 1, except that 12% by volume of a zinc oxide powder having an average particle size of 0.5 µm (first grade of JIS standard zinc oxide, Hakusuitech, Ltd.) was used instead of the titanium dioxide particles. Further, an optical reflectance evaluation test and a total luminous flux evaluation test for an LED-mounted sample were carried out in the same manner as in Example 1. The obtained results are shown in Table 1. The optical reflectance results are also illustrated in FIG. 3.

Example 6

A light-reflective anisotropic conductive adhesive having a white appearance was obtained in the same manner as in Example 1, except that 12% by volume of an aluminum oxide powder having an average particle size of 0.5 µm (AE2500-SI, Admatechs, Co., Ltd.) was used instead of the titanium dioxide powder. Further, an optical reflectance evaluation test and a total luminous flux evaluation test for an LED-mounted sample were carried out in the same manner as in Example 1. The obtained results are shown in Table 1.

Example 7

A light-reflective anisotropic conductive adhesive having a white appearance was obtained in the same manner as in Example 1, except that 12% by volume of a titanium dioxide powder having an average particle size of 0.2 µm (CR602, Ishihara Sangyo Kaisha, Ltd.) was used instead of the titanium dioxide powder having an average particle size of 0.5 µm. Further, an optical reflectance evaluation test and a total luminous flux evaluation test for an LED-mounted sample were carried out in the same manner as in Example 1. The obtained results are shown in Table 1.

Example 8

A light-reflective anisotropic conductive adhesive having a white appearance was obtained in the same manner as in Example 1, except that Ni-coated resin conductive particles having an average particle size of 5 µm (particles formed by coating a 0.2 µm-thick electroless nickel plating on spherical acrylic resin particles having an average particle size of 4.6 µm) were used instead of the Au-coated resin conductive particles. Further, an optical reflectance evaluation test and a total luminous flux evaluation test for an LED-mounted sample were carried out in the same manner as in Example 1. The obtained results are shown in Table 1.

Example 9

A light-reflective anisotropic conductive adhesive having a white appearance was obtained in the same manner as in Example 1, except that light-reflective insulating particles having an average particle size of 5.0 µm prepared in the following manner were used instead of the titanium dioxide powder having an average particle size of 0.5 µm. Further, an optical reflectance evaluation test and a total luminous flux evaluation test for an LED-mounted sample were carried out in the same manner as in Example 1. The obtained results are shown in Table 1.
(Preparation of Light-Reflective Insulating Particles)

To a flask equipped with a stirrer, 5 g of granular silver particles (average particle size 1.0 µm) and 50 ml of toluene were added. Then, while stirring, 0.25 g of a silane coupling agent (3-methacryloxypropyltriethoxysilane) was added, and the resultant mixture was stirred for 60 minutes at 25° C. Next, 2 g of methyl methacrylate, 2 g of 2-hydroxyethyl methacrylate, 0.04 g of benzoyl peroxide, and 1 g of 2,4-tolylenediisocyanate were added to the mixture. The mixture was then stirred for 12 hours at 80° C. to obtain insulating coating silver particles as light-reflective insulating particles. The average particle size of the light-reflective insulating particles including the insulating coating was 5.0 µm.

Example 10

A light-reflective anisotropic conductive adhesive having a white appearance was obtained in the same manner as in Example 1, except that light-reflective conductive particles having an average particle size of 5 µm prepared in the following manner were used instead of the Au-coated resin conductive particles. Further, an optical reflectance evaluation test and a total luminous flux evaluation test for an LED-mounted sample were carried out in the same manner as in Example 1. The obtained results are shown in Table 1.
(Production of Light-Reflective Conductive Particles)

Light-reflective conductive particles were obtained by adding 4 parts by mass of a titanium dioxide powder having an average particle size of 0.5 µm (KR-380, Titan Kogyo, Ltd.) and 20 parts by mass of Au-coated resin conductive particles having a brown appearance and an average particle size of 5 µm (particles formed by coating a 0.2 µm-thick electroless gold plating on spherical acrylic resin particles having an average particle size of 4.6 µm) to a mechanofusion apparatus (AMS-GMP, Hosokawa Micron Group), to deposit a light-reflecting layer having a thickness of approximately 0.5 µm formed from titanium oxide particles on the surface of the conductive particles. The appearance of these light-reflective conductive particles was grey.

Comparative Example 1

The colorless, transparent thermosetting epoxy binder composition having a refractive index of approximately 1.50 (YX-8000, JER Co. Ltd.: containing 100% by mass of MeHHPA) used in Example 1 were subjected to an optical reflectance evaluation test and a total luminous flux evaluation test for an LED-mounted sample in the same manner as in Example 1. The obtained results are shown in Table 1. The optical reflectance results are also illustrated in FIG. 3.

Comparative Example 2

An anisotropic conductive adhesive having a brown appearance was obtained in the same manner as in Example 1, except that the light-reflective insulating particles were not used. Further, an optical reflectance evaluation test and a total luminous flux evaluation test for an LED-mounted sample were carried out in the same manner as in Example 1. The obtained results are shown in Table 1. The optical reflectance results are also illustrated in FIG. 3.

Comparative Example 3

An anisotropic conductive adhesive having a black appearance was obtained in the same manner as in Example 1, except that the light-reflective insulating particles were not used, and Ni-coated resin conductive particles having an average particle size of 5 μm (particles formed by coating a 0.2 μm-thick electroless nickel plating on spherical acrylic resin particles having an average particle size of 4.6 μm) were used instead of the Au-coated resin conductive particles. Further, an optical reflectance evaluation test and a total luminous flux evaluation test for an LED-mounted sample were carried out in the same manner as in Example 1. The obtained results are shown in Table 1.

Comparative Example 4

An anisotropic conductive adhesive having a brown appearance was obtained in the same manner as in Example 1, except that a silicon oxide powder having an average particle size of 0.5 μm (Seahosta KEP-30, Nihon Shokubai Co., Ltd.) was used instead of the titanium dioxide powder having an average particle size of 0.5 μm. Further, an optical reflectance evaluation test and a total luminous flux evaluation test for an LED-mounted sample were carried out in the same manner as in Example 1. The obtained results are shown in Table 1.

Comparative Example 5

An anisotropic conductive adhesive having a brown appearance was obtained in the same manner as in Example 1, except that a titanium oxide powder having an average particle size of 0.02 μm (TTO-55D, Ishihara Sangyo Kaisha, Ltd.) was used instead of the titanium dioxide powder having an average particle size of 0.5 μm. Further, an optical reflectance evaluation test and a total luminous flux evaluation test for an LED-mounted sample were carried out in the same manner as in Example 1. The obtained results are shown in Table 1.

TABLE 1

| | | Example | | | | | | | |
|---|---|---|---|---|---|---|---|---|---|
| | | 1 | 2 | 3 | 4 | 5 | 6 | 7 | 8 |
| Conductive Particle | Surface Metal | Au | Au | Au | Au | Au | Au | Au | Ni |
| | Particle Size (μm) | 5.0 | 5.0 | 5.0 | 5.0 | 5.0 | 5.0 | 5.0 | 5.0 |
| Light-reflective Insulating Particles | Type | $TiO_2$ | $TiO_2$ | $TiO_2$ | BN | ZnO | $Al_2O_3$ | $TiO_2$ | $TiO_2$ |
| | Particle Size (μm) | 0.5 | 0.5 | 0.5 | 0.5 | 0.5 | 0.5 | 0.2 | 0.5 |
| | Refractive Index n1 | 2.71 | 2.71 | 2.71 | 2.2 | 1.95 | 1.78 | 1.76 | 2.71 |
| | Vol. % | 12 | 7 | 21 | 12 | 12 | 12 | 12 | 12 |
| Light-reflective Anisotropic Conductive Adhesive | Color | White | White | White | White | White | White | White | White |
| | Reflectance (%) | 62 | 51 | 70 | 56 | 40 | 30 | 62 | 68 |
| | Total Luminous Flux (mlm) | 390 | 370 | 420 | 370 | 350 | 310 | 390 | 420 |

| | | Example | | Comparative Example | | | |
|---|---|---|---|---|---|---|---|
| | | 9 | 10 | 1 | 2 | 3 | 4 |
| Conductive Particle | Surface Metal | Au | Au *1 | — | Au | Ni | Au |
| | Particle Size (μm) | 5.0 | 5.0 | — | 5.0 | 5.0 | 5.0 |
| Light-reflective Insulating Particles | Type | Ag *2 | $TiO_2$ | — | — | — | $SiO_2$ |
| | Particle Size (μm) | 5.0 | 0.5 | — | — | — | 0.5 |
| | Refractive Index n1 | — | 2.71 | — | — | — | 1.45 |
| | Vol. % | 12 | 12 | — | — | — | 12 |
| Light-reflective Anisotropic Conductive Adhesive | Color | White | White | Transparent | Brown | Black | Brown |
| | Reflectance (%) | 57 | 75 | 20 | 8 | 9 | 8 |
| | Total Luminous Flux (mlm) | 360 | 450 | 290 | 200 | 210 | 205 |

*1 $TiO_2$-Coated Au Particles,
*2 Resin-Coated Ag Particles

As can be seen from Table 1, the light-reflective anisotropic conductive adhesives of Examples 1 to 10, which contained light-reflective insulating particles, all had a light reflectance of 30% or more, and reflected blue light having a wavelength of 450 nm without change. Further, the total luminous flux was also 300 mlm or more. In particular, Example 10, which used light-reflective conductive particles as conductive particles, exhibited especially high values for reflectance and total luminous flux.

In contrast, since Comparative Examples 1 to 3 did not have a light-reflecting layer on the surface of the light-reflective insulating particles, light reflectance was 20% or less, and the total luminous flux was less than 300 mlm. For Comparative Example 4, which used silicon oxide for the insulating particles, the anisotropic conductive adhesive had a brown color, and light reflectance was about 10%. The reason for this can be thought to be because there was hardly any difference in refractive index between the silicon oxide and the heat setting binder composition of the anisotropic conductive adhesive. Further, for Comparative Example 5, which used titanium dioxide for the insulating particles, sufficient light reflectance was not exhibited because the particle size was no greater than half 450 nm.

INDUSTRIAL APPLICABILITY

The light-reflective anisotropic conductive adhesive of the present invention can prevent a deterioration in light-emitting efficiency even if a light-reflecting layer that causes production costs to increase is not provided to a light-emitting device, when producing a light-emitting device by flip-chip mounting a light-emitting element such as a light-emitting diode (LED) element to a wiring board using an anisotropic conductive adhesive. Therefore, the light-reflective anisotropic conductive adhesive of the present invention is useful when flip-chip mounting an LED element.

REFERENCE SIGNS LIST

1 Core Particle
2 Inorganic Particle
3 light-reflecting layer
4 thermoplastic resin
10 light-reflective conductive particle
11 cured product of thermosetting resin composition
21 substrate
22 connection terminal
23 LED element
24 n electrode
25 p electrode
26 bump
100 cured product of light-reflective anisotropic conductive adhesive
200 light-emitting device

The invention claimed is:

1. A light-reflective anisotropic conductive adhesive used for anisotropic conductive connection of a light-emitting element to a wiring board, comprising a thermosetting resin composition, conductive particles, and light-reflective insulating particles, wherein
the light-reflective insulating particles are boron nitride particles, and
the conductive particle comprises a light-reflective conductive particle formed from a core particle coated with a metal material, and a light-reflecting layer formed on a surface of the core particle, the light-reflecting layer being a multilayer structure formed from a thermoplastic resin and zinc oxide particles, the thermoplastic resin being a composition that is colorless and transparent such that the thermoplastic resin exhibits a light transmittance (JIS K7105) of 80% or more at a 1 cm light path length of visible light having a wavelength of 380 to 780 nm.

2. The light-reflective anisotropic conductive adhesive according to claim 1, wherein the light-reflective insulating particle has a refractive index (JIS K7142) that is greater than a refractive index (JIS K7142) of a cured product of the thermosetting resin composition.

3. The light-reflective anisotropic conductive adhesive according to claim 1, wherein the light-reflective insulating particle is a resin-coated metal particle formed by coating a surface of a scale-like or spherical particle with an insulating resin.

4. The light-reflective anisotropic conductive adhesive according to claim 1, wherein an amount of the light-reflective insulating particles in the light-reflective anisotropic conductive adhesive is 1 to 50% by volume.

5. The light-reflective anisotropic conductive adhesive according to claim 1, wherein the thermosetting resin composition includes an epoxy resin and an acid anhydride curing agent.

6. The light-reflective anisotropic conductive adhesive according to claim 1, wherein an amount of the light-reflective conductive particles is 1 to 100 parts by mass based on 100 parts by mass of the thermosetting resin composition.

7. The light-reflective anisotropic conductive adhesive according to claim 1, wherein the thermoplastic resin exhibits a light transmittance (JIS K7105) of 90% or more at a 1 cm light path length of visible light having a wavelength of 380 to 780 nm.

8. A light-emitting device comprising a wiring board and a light-emitting element flip-chip-mounted thereon through the light-reflective anisotropic conductive adhesive according to claim 1 provided therebetween.

9. The light-emitting device according to claim 8, wherein the light-emitting element is a light-emitting diode.

* * * * *